Aug. 22, 1961 J. W. ENGLUND 2,997,578

FREQUENCY CONVERTER

Filed March 22, 1960

INVENTOR.
JOHN W. ENGLUND
BY
Eugene M. Whitacre
ATTORNEY 2,997,578

FREQUENCY CONVERTER

John W. Englund, Somerville, N.J., assignor to Radio Corporation of America, a corporation of Delaware Filed Mar. 22, 1960, Ser. No. 16,884
12 Claims. (Cl. 250—20)

This invention relates generally to signal processing means for radio receivers, and more particularly to semiconductor frequency converter circuits for heterodyning a received signal modulated carrier wave with a locally generated oscillator wave to produce an intermediate frequency wave.

In transistor receivers, it is common practice to apply a received signal modulated radio frequency carrier wave to an autodyne converter to derive a resultant wave of intermediate frequency. An autodyne converter circuit combines the functions of generating a local oscillator wave and mixing the received signal modulated carrier wave with the local oscillator wave in a circuit employing a single transistor. Although the autodyne converter circuit provides the advantages of circuit simplicity and low cost as compared to converter circuits using separate transistors for the mixer and oscillator functions, autodyne circuits, as applied to transistors, have the disadvantage that the circuit is not readily adaptable for control by an automatic gain control (AGC) signal. If full automatic gain control is attempted, the local oscillator will cease to oscillate, thus disabling the receiver. The ability to apply AGC to the converter of a transistor radio receiver is an important factor in avoiding distortion that might occur in the converter stage or in succeeding stages under strong signal conditions. Furthermore in receivers including a radio frequency (RF) amplifier, the initial application of a strong signal to the transistor converter input circuit may cause the converter to cease oscillating. This is because the RF amplifier is initially operating at full gain, and the large signal applied to the converter is rectified in the base emitter path producing a voltage which biases the transistor to a point at less than unity gain so that oscillation ceases. Thus, the receiver will remain blocked as long as the applied signal remains present and is not effective to develop an AGC voltage to reduce the gain of the RF amplifier stage.

It is an object of this invention to provide an improved frequency converter stage using transistor devices.

Another object of this invention is to provide an improved frequency converter circuit for simultaneously performing the functions of oscillation generation and mixing using only a single transistor wherein the conversion gain may be controlled by an AGC voltage without detrimentally affecting the operation of the oscillator portion of the circuit.

It is a still further object of this invention to provide an improved automatic gain control system for frequency converter circuits used in transistor receivers.

A further object of this invention is to provide an improved transistor receiver including an RF amplifier stage driving a transistor frequency converter stage wherein a strong signal applied to the converter stage by the RF amplifier stage does not affect the oscillation generating function of the converter stage.

A frequency converter circuit in accordance with the invention includes a transistor device with the usual base and collector electrodes and a pair of emitter electrodes. The circuit includes connections for applying a received signal modulated radio frequency carrier wave between a first of the emitter electrodes and the base electrode of the transistor device. The second of the emitter electrodes in combination with the base and collector electrodes are connected to provide an oscillation generator. The heterodyne action between the locally generated oscillator wave and the received carrier wave takes place in the common internal base resistance of the transistor to produce the desired beat frequency signal. The desired beat frequency signal hereinafter referred to as the intermediate frequency signal (IF), is amplified in the common collector circuit of the transistor. An automatic gain control voltage, the magnitude of which varies as the function of received signal strength, is applied between the first emitter electrode and the base. As the signal strength increases, automatic gain control voltage causes the first emitter current to decrease without materially effecting the operation of the oscillator portion. In fact, as the first emitter current is reduced to zero, the current flowing in the second (oscillator) emitter actually increases slightly which is beneficial to the operation of the device as an oscillator.

The novel features that are considered to be characteristic of this invention are set forth with particularity in the appended claims. The invention itself, however, both as to its organization and method of operation as well as additional objects and advantages thereof, will best be understood from the following description when read in connection with the accompanying drawings in which:

Figure 1:
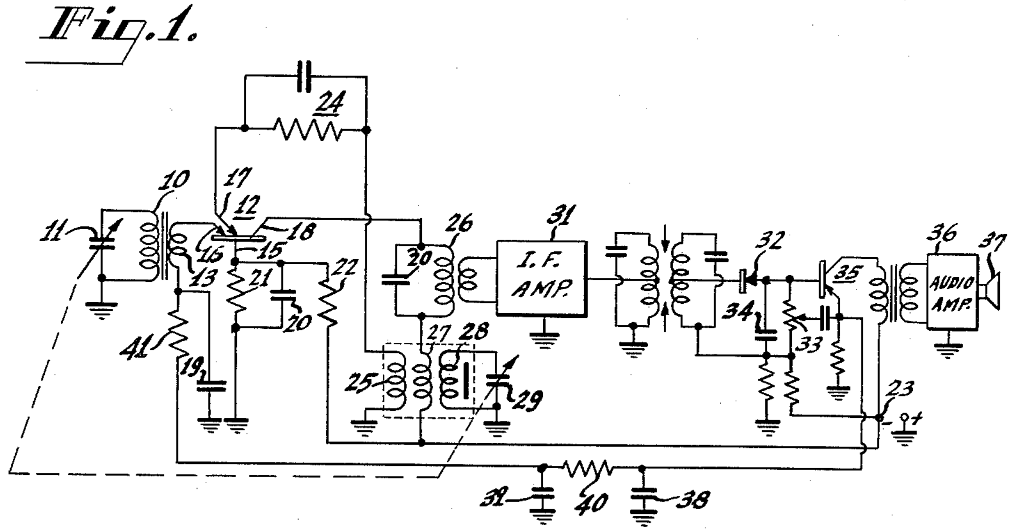
FIGURE 1 is a schematic circuit diagram of a transistor frequency converter embodying the invention.

The receiver shown in the schematic circuit diagram of FIGURE 1 includes a ferrite loop antenna winding 10 which is tuned to the frequency of a signal to be received by a variable capacitor 11. Received radio frequency waves developed in the antenna circuit are coupled to the input circuit of a frequency converter stage 12 by a winding 13 that is coupled to the loop antenna winding 10. The frequency converter stage 12 includes a transistor device having a base electrode 15, a first emitter electrode 16, a second emitter electrode 17 and a collector electrode 18.

One end of the winding 13 is connected to the first emitter electrode 16 and the other end thereof is connected to the base 15 through ground in a path including a pair of signal bypass capacitors 19 and 20. It is understood that the converter stage 12 may be preceded by a radio frequency amplifier stage, if desired, and in such case the tunable antenna input circuit would be replaced by a suitable coupling circuit between the converter stage 12 and the RF amplifier stage.

A suitable D.C. biasing voltage is applied to the base electrode 15 of the transistor device by a voltage divider including a first resistor 21 and a second resistor 22 connected in series between the negative terminal 23 of an operating potential supply and ground. As noted above, the base electrode 15 is bypassed to ground through the signal bypass capacitor 20. The second emitter electrode 17 which is individual to the oscillator portion of the converter stage 12 is connected to ground through the series combination of a self biasing network 24 and a feedback winding 25.

The collector electrode 18 of the converter stage is connected by way of the primary winding of an intermediate frequency transformer 26 and a coupling coil 27 to the negative terminal 23 of the operating potential supply source. The coil 27 is inductively coupled to the feedback winding 25 and to a tank circuit including an inductor 28 and a variable capacitor 29 which tank circuit determines the frequency of self oscillation in the converter circuit. The variable capacitors 11 and 29 which determine the tuning of the signal selection and oscillator circuits respectively are mechanically ganged together for unicontrol operation by a single tuning means, not shown.

The primary winding 26 of the intermediate frequency transformer is tuned to the intermediate frequency by a capacitor 30, and intermediate frequency waves developed thereacross are applied to an IF amplifier stage 31 before being fed to a second detector stage including a rectifier device 32. The signal intelligence derived from the IF wave is developed across the second detector load circuit which includes a variable volume control resistor 33 and a capacitor 34, and then applied through an audio frequency coupling capacitor to the emitter electrode of a transistor audio frequency driver stage 35. Audio frequency signals amplified by the driver stage 35 are aplied to an audio amplifier stage 36 before application to a loudspeaker 37.

The anode of the rectifier device 32 is directly connected to the base electrode of the driver stage transistor so that increases in the received signal strength produce an increasing direct voltage component across the resistor 33 that is of a polarity to bias the audio frequency driver stage 35 further in the forward direction. This produces an increased emitter current in the audio frequency driver stage 35 so that a more negative voltage is developed at the emitter electrode of the driver stage with respect to ground.

The automatic gain control for the receiver is derived from the emitter electrode of the driver stage 35, and is filtered by capacitors 38 and 39 and the resistors 40 and 41 before being applied to the first emitter electrode 16 of the transistor device. As noted above, the circuit is arranged so that the resulting AGC voltage becomes more negative as the strength of the received signal increases, thus causing the emitter electrode 16 current to be reduced with increasing signal strength.

Referring now to the operation of the converter stage, the oscillator portion includes the base electrode 15, second emitter electrode 17 and collector electrode 18, in combination with the circuits connected to these electrodes. The oscillator output circuit including the coupling coil 27 and oscillator tank circuit 28—29 is regeneratively coupled to the oscillator input circuit which includes the feedback winding 25. At oscillator frequencies the I.F. output circuit which is connected in series between the coupling coil 27 and collector electrode 18 presents a low impedance.

The signal portion of the converter stage includes the base electrode 15, second emitter electrode 17 and collector electrode 18 in combination with the circuits connected therewith. The circuit paths from the base electrode 15 to ground and from the collector electrode to the ground through the operating potential supply source which are common to both the oscillator and signal portions of the converter stage. The internal base resistance of the transistor device 12 is also common to the oscillator and signal portions of the converter stage and because of the nonlinearity of the internal base resistance, the oscillator wave and received signal modulated carrier wave are heterodyned to produce beat frequency signals including the desired intermediate frequency signal.

Control of the converter or conversion gain may be achieved without deleteriously affecting the oscillation generating function of the circuit since the current flowing in the first emitter 16 is substantially independent of the current flowing in the second emitter 17. The collector current is, of course, the sum of the current flowing in the first emitter 16 and the second emitter 17. Under no signal conditions, and the conversion gain is maximum, the emitter 16 current is at a maximum, and the emitter 17 current is a function of the oscillator circuit portion parameters. As the received signal strength increases, the emitter 16 current decreases until the current in the collector 18 will be entirely due to the current which flows through the second emitter 17.

Since the signal circuits connected to the emitter electrode 16 are not common to the oscillator portion of the converter circuit extremely good control of conversion gain has been achieved. In other words, when the emitter 16–base 15 junction is blocked, by an AGC voltage, very little of the signal voltage is developed across the other circuits of the converter, so that the resulting I.F. wave is quite small. In practical circuits a signal gain reduction on the order of 50 db attenuation has been achieved without adversely affecting the operation of the oscillator portion.

When the first emitter 16 current is reduced to zero in the presence of a strong signal, the converter stage 12 operates as a passive attenuator for received radio signals. The effectiveness of the converter stage as an attenuator for very strong signals may be degraded if the oscillator portion of the circuit tends to operate as a conventional autodyne converter. In other words, strong received signals may be coupled through stray paths to the oscillator circuits such as the feedback winding 25, the tuned circuit including the inductor 28 and the variable capacitor 29 or the coupling coil 27. In such case the oscillator portion of the converter may function as a conventional converter operating in the common base mode for both oscillator and received signals. To enhance the gain control action, and the operation of the converter stage as an attenuator for very strong signals, it may be desirable to shield the windings 25, 27 and 28 by enclosure in a conductive shield can, as shown, to reduce stray pickup of the received radio signals.

Figures 2, 3, 4:
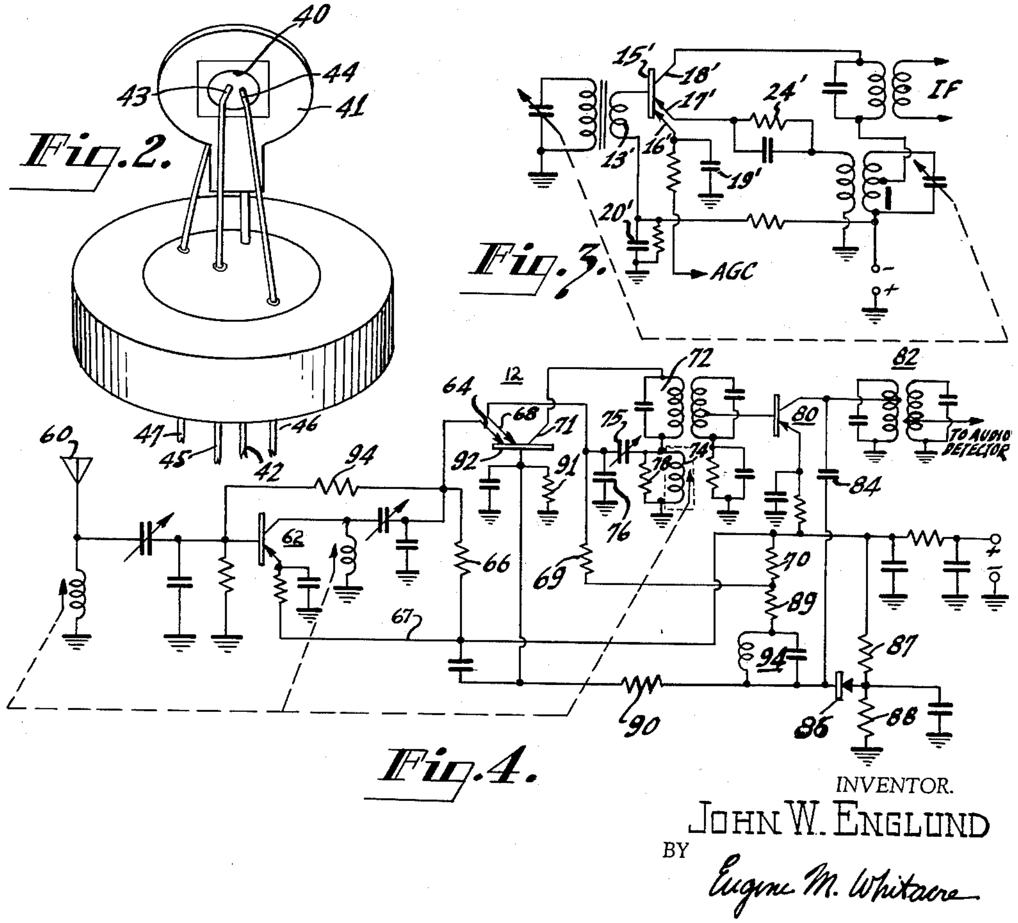
FIGURE 2 is a perspective view greatly enlarged of a double emitter transistor which may be used in frequency converter circuits embodying the invention.
FIGURE 3 is a schematic circuit diagram of another embodiment of a transistor frequency converter embodying the invention.
FIGURE 4 is a schematic circuit diagram of still another embodiment of a transistor frequency converter embodying the invention.

FIGURE 2 illustrates a double emitter drift transistor device of the type which may be used in the heterodyne frequency converter circuit of FIGURE 1. The device which is normally encapsulated, includes a base 40 which is conductively connected to a conductive mounting structure 41 supported on an externally accessible connecting lead 42. A first emitter electrode 43 and a second emitter electrode 44 corresponding to the emitter electrodes 16 and 17 of FIGURE 1, are alloyed onto one side of the base and a collector electrode, not shown, is alloyed onto the opposite side of the base. The first and second emitter electrodes 43 and 44 and collector electrode are accessible externally by means of the collecting leads 45, 46 and 47 respectively.

The base 40 includes a diffused n-type region with varying impurity concentration. The impurity distribution is a maximum at the emitter junctions and decreases to a constant value near the collector junction. It is desirable to have such an impurity distribution since better frequency response, higher gain and lower feedback capacitances can be realized with such a structure. The collector periphery encompasses the two emitters and thus assures the collection of carriers injected from either emitter. To prevent interaction between the circuits connected to the two emitters due to the low resistance of the maximum impurity region, a portion of the area between the two emitters is etched through to a less concentrated impurity region of higher resistivity.

The schematic circuit diagram of FIGURE 3 illustrates another embodiment of a frequency converter circuit in accordance with the invention. In the circuit of FIGURE 3 only the frequency converter stage has been shown for the purpose of simplifying the drawings. Otherwise the circuit of FIGURE 3 is similar to that of FIGURE 1 with the exception that the signal input coupling winding 13′ is connected in the common input circuit of the signal and oscillator portions of the input circuit. More specifically, the high signal potential side of the winding 13′ is connected to the base electrode 15′, and the low signal potential side of this winding is connected through the bypass capacitors 20′ and 19′ to the first emitter electrode 16′. In other words, the converter stage operates in the common emitter mode for received signals, and in the common base mode for oscillation. As in the case of FIGURE 1, the AGC potential is applied to the first emitter electrode so that the converter gain may be controlled without affecting the oscillator circuit operation. Another difference in the converter stage of FIGURE 3 is that the coupling coil 27 has been omitted, and the collector 18′ current path is completed through a portion of the oscillator tank circuit inductance 18.

Since the signal input circuit including the input winding 13′ is common to the oscillator and signal portions of the converter stage, consideration must be given to the fact that the oscillator portion of the converter stage may tend to operate in the manner of known types of converters when the emitter 16′ current is reduced or cutoff by strong signals. Such action would defeat the effectiveness of the gain controlling action. To reduce the effectiveness of the oscillator portion of the converter stage as a self oscillating converter, the resistor-capacitor combination 24′ may be made degenerative for received signals but not for oscillator signals.

FIGURE 4 is a schematic circuit diagram of a transistor broadcast receiver wherein the transistor frequency converter is driven by an RF amplifier. Signal modulated carrier waves received by an antenna 60 are applied to the base electrode of an RF amplifier transistor 62. The RF amplifier includes permeability tuned input and output circuits for selecting a desired RF carrier wave. Signals amplified by the RF amplifier 62 are applied to the first emitter electrode 64 of the transistor converter stage 12. The transistor device of the converter stage 12 shown in FIGURE 4 is of the type shown and described in connection with FIGURE 2. The major difference between the converter circuit of FIGURE 4 and that of FIGURE 1, is that the oscillator portion of the circuit of FIGURE 4 is permeability tuned, and the AGC voltage is applied to the base electrode rather than the first emitter electrode.

The first emitter electrode 64 is connected through an emitter resistor 66 to an operating potential supply bus 67. The second emitter electrode 68 is also connected to the operating potential supply bus 67 through the resistors 69 and 70. The collector 71 of the transistor device is connected to ground through an IF output circuit 72 and the oscillator tank circuit which is comprised of the permeability tuned inductor 74 and the capacitors 75 and 76. The inductor 74 is mechanically ganged for unicontrol operation with the permeability tuned RF amplifier input and output circuits as is indicated by the dashed lines. As noted in connection with FIGURE 1, the inductor 74 is shielded by a conductive can, or the like, to minimize stray pickup of the received signals. The oscillator voltage has a tendency to increase with decreasing frequency, due to the increasing oscillator load impedance with decreasing frequency. A resistor 78 is shunted across the inductor 74 to maintain the oscillator voltage relatively constant across the frequency band.

IF signals developed across the tuned output circuit 72 are applied to an IF amplifier 80. The amplified signals are coupled through an IF transformer 82 to an audio detector stage or to further IF amplifier stages, not shown.

The primary winding of the intermediate frequency transformer 82 is coupled by way of a capacitor 84 to an AGC rectifier 86. The anode of the rectifier 86 is biased to a fixed operating point by a pair of resistors 87 and 88 connected between ground and the operating potential supply bus 67, and the cathode of the rectifier 86 is initially biased to a potential close to that of the anode by a voltage divider network including the resistors 70, 89, 90 and 91 which is also connected between ground and the operating potential supply bus 67.

The IF wave is rectified by the rectifier 86 to develop an AGC voltage. It will be noted that the rectifier 86 has two parallel direct current paths, one being through the resistors 88, 90 and 91, and the other being through the resistors 70, 87 and 89. The component of D.C. voltage across these various resistors due to the rectification of the IF wave causes the potential of the second emitter 68 and the base 92 of the transistor device to move in the same direction. In other words, as the signal strength varies, the potential difference between the base 92 and the second emitter 68 does not change enough to affect the oscillator portion of the converter circuit. A trap network 94 tuned to the intermediate frequency is connected between the resistor 89 and the cathode of the diode 86 to prevent attenuation of the intermediate signal.

As noted above, the base 92 potential varies as a function of received signal strength. Specifically as the signal gets stronger the base gets more positive. Since the D.C. potential of the first emitter 64 is relatively fixed, this means that the AGC potential increases the reverse bias between base 92 and emitter 64 thereby decreasing the conversion gain of the converter stage. This increased reverse bias reduces the current flow in the emitter resistor 64 causing the emitter potential to become less negative (more positive). This change in potential is in the proper direction to provide an AGC voltage for the base electrode of the RF amplifier stage 62, and accordingly the emitter electrode 64 is connected to the base electrode of the RF amplifier through a resistor 94.

What is claimed is:

1. A frequency converter including a transistor device having a first emitter electrode, a second emitter electrode, a base electrode and a collector electrode, an input circuit for signal modulated carrier waves connected between said first emitter electrode and said base electrode, means providing a circuit coupled to said collector electrode including an intermediate frequency output circuit, means regeneratively coupling said circuit coupled to said collector electrode between said base and second emitter electrode, and means for applying a gain control voltage between said base and first emitter electrodes to control the conversion gain of said frequency converter.

2. A frequency converter including a transistor device having a first emitter electrode, a second emitter electrode, a base electrode and a collector electrode, an input circuit for signal modulated carrier waves connected between said first emitter electrode and said base electrode, means providing an intermediate frequency output circuit and a coupling coil connected in series between said collector electrode and an operating potential supply terminal for said converter, a feedback winding coupled to said coil and connected in series between said second emitter electrode and a point of reference potential for said converter to provide a regenerative feedback to sustain oscillation between said second emitter electrode, said base and said collector electrode, and means for applying a gain control voltage to said first emitter electrode to control the conversion gain of said frequency converter without substantially affecting the current in said second emitter electrode.

3. In a radio receiver the combination comprising, a loop antenna, a variable capacitor for tuning said loop antenna to the frequency of a signal to be received, a winding coupled to said loop antenna having a high signal potential terminal and a low signal potential terminal effectively connected to a point of reference potential for said receiver, a frequency converter circuit including a transistor device having a first emitter electrode, a second emitter electrode, a base electrode and a collector electrode, means connecting the high signal potential terminal of said winding to said first emitter electrode, means connected between said base electrode and said point of reference potential providing a low impedance path for radio frequency signals, means regeneratively coupling said collector electrode to said second emitter electrode to sustain oscillation in said converter stage, an intermediate frequency output circuit coupled to said collector circuit, and means providing a gain control circuit connected between said base electrode and said first emitter electrode.

4. A frequency converter including a transistor device having a base member with first and second emitter electrodes alloyed onto one side of said base member and a collector electrode alloyed onto the opposite side of said base member, said base member including a diffused impurity region with maximum impurity concentration on the side of said base member to which said emitter electrodes are alloyed and decreasing impurity concentrations in a direction toward said collector electrode, said base member having a portion of the surface thereof removed between said emitter electrodes to a depth to materially increase the resistivity between said emitter electrodes as compared to the resistivity without said portion removed, an input circuit for signal modulated carrier waves connected between said first emitter electrode and said base electrode, means coupling said base, collector and second emitter electrodes to operate as an oscillation generator, means providing an intermediate frequency output circuit coupled to said collector electrode, and means for controlling said first emitter electrode current substantially without affecting said second emitter electrode current.

5. In a radio receiver of the type including circuits for developing an automatic gain control potential the magnitude of which varies as a function of received signal strength, the combination comprising, a frequency converter circuit having an input circuit for signal modulated radio frequency waves and an output circuit for intermediate frequency waves, said frequency converter circuit including a transistor device having a first emitter electrode, a second emitter electrode, a base electrode and a collector electrode, means connecting said input circuit between said first emitter electrode and said circuits for developing an automatic gain control potential so that said automatic gain control potential is applied to said first emitter electrode, a capacitor having low impedance to said radio frequency waves connecting the junction of said input circuit and said automatic gain controlling circuit to a point of reference potential, means interconnecting said second emitter, base and collector electrodes to sustain oscillation, means for biasing said base electrodes at a substantially fixed potential and for providing a low impedance path to said point of reference potential for said radio frequency waves, and means coupling said output circuit to said collector electrode.

6. In a radio receiver the combination comprising, a frequency converter including an input circuit for signal modulated radio frequency waves having a high signal potential terminal and a low signal potential terminal effectively connected to a point of reference potential for said receiver, and an output circuit for intermediate frequency waves, a transistor device having a first emitter electrode, a second emitter electrode, a base electrode and a collector electrode, means connecting the high signal potential terminal of said winding to said base electrode, means for maintaining said base electrode at a relatively fixed potential with respect to said point of reference potential, means connected between said first emitter electrode and said point of reference potential providing a low impedance path for said radio frequency waves, means coupling said collector, base and second emitter electrodes to sustain oscillation in said converter stage, means coupling said output circuit coupled to said collector electrode, and means providing an automatic gain control circuit connected between said base electrode and said first emitter electrode.

7. A radio receiver as defined in claim 6 wherein a frequency selective network is connected to said second emitter electrode to provide substantially more degeneration for said radio frequency waves than for said oscillation.

8. A frequency converted comprising an input circuit for applied radio frequency waves and an output circuit for intermediate frequency waves, a transistor device having a first emitter electrode, a second emitter electrode, a base electrode and a collector electrode, means connecting said input circuit between said first emitter electrode and a point of reference potential, means connected between said base electrode and said point of reference potential providing a low impedance path for radio frequency signals, means coupling said collector, base and second emitter electrodes to sustain oscillation in said converter stage, means coupling said output circuit to said collector electrode, a gain control circuit for developing a gain control voltage the magnitude of which is a function of the strength of said radio frequency waves, and means for applying at least a portion of said gain controlling voltage to said base and to said second emitter electrode.

9. In a radio receiver of the type including circuits for developing an automatic gain control potential the magnitude of which varies as a function of received signal strength, the combination comprising, a frequency converter circuit having an input circuit for signal modulated radio frequency waves and an output circuit for intermediate frequency waves, said frequency converter circuit including a transistor device having a base member with first and second emitter electrodes alloyed onto one side of said base member and a collector electrode alloyed onto the opposite side of said base member, said base member including a diffused impurity region with maximum impurity concentration on the side of said base member to which said emitter electrodes are allowed and decreasing impurity concentrations in a direction toward said collector electrode, said base member having at least a portion of the surface thereof removed between said emitter electrodes to a depth to materially increase the resistivity between said emitter electrodes as compared to the resistivity between said emitter electrodes without said portion removed, means connecting said input circuit between said first emitter electrode and said circuits for developing an automatic gain control potential so that said automatic gain control potential is applied to said first emitter electrode, a capacitor having low impedance to said radio frequency waves connecting the junction of said input circuit and said automatic gain controlling circuit to a point of reference potential, means interconnecting said second emitter, base and collector electrodes to sustain oscillation, means for biasing said base electrodes at a substantially fixed potential and for providing a low impedance path to said point of reference potential for said radio frequency waves, and means coupling said output circuit to said collector electrode.

10. A frequency converter as defined in claim 8 including a resistor connected between said first emitter and a point of relatively fixed potential whereby a change in said gain controlling voltage applied to said base electrode causes a change in a potential between said first emitter electrode and said base, and a substantially smaller change in potential between said second emitter electrode and said base.

11. A radio receiver as defined in claim 5 wherein at least a portion of said means coupling said base, collector and second emitter electrodes are shielded to reduce stray pickup of said radio frequency waves.

12. A frequency converter as defined in claim 1, wherein said converter is connected to operate in the common base mode for both said carrier waves and said oscillation signals.

References Cited in the file of this patent

UNITED STATES PATENTS

| | | |
|---|---|---|
| 2,476,323 | Rack | July 19, 1949 |
| 2,713,117 | Haegele | July 12, 1955 |
| 2,853,602 | Farber | Sept. 23, 1958 |